(12) United States Patent
Cheng et al.

(10) Patent No.: US 9,312,504 B2
(45) Date of Patent: Apr. 12, 2016

(54) FLEXIBLE ORGANIC LIGHT EMITTING DIODE DISPLAY DEVICE AND MANUFACTURING METHOD THEREOF

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD, Beijing (CN)

(*) Notice: Subject to any disclaimer, the term of this patent is extended or adjusted under 35 U.S.C. 154(b) by 0 days.

(21) Appl. No.: 14/353,200

(22) PCT Filed: Nov. 1, 2013

(86) PCT No.: PCT/CN2013/086466
§ 371 (c)(1),
(2) Date: Apr. 21, 2014

(87) PCT Pub. No.: WO2015/014036
PCT Pub. Date: Feb. 5, 2015

(65) Prior Publication Data
US 2015/0194618 A1 Jul. 9, 2015

(30) Foreign Application Priority Data

Aug. 2, 2013 (CN) .......................... 2013 1 0334937

(51) Int. Cl.
| H01L 51/00 | (2006.01) |
| H01L 21/77 | (2006.01) |
| H01L 51/52 | (2006.01) |
| H01L 27/32 | (2006.01) |
| H01L 51/56 | (2006.01) |
| H01L 51/50 | (2006.01) |

(52) U.S. Cl.
CPC ............ *H01L 51/0097* (2013.01); *H01L 21/77* (2013.01); *H01L 27/32* (2013.01);

(Continued)

(58) Field of Classification Search
CPC . H01L 51/0097; H01L 51/52; H01L 51/5253; H01L 51/56; H01L 51/5012
See application file for complete search history.

(56) References Cited

U.S. PATENT DOCUMENTS 7,728,516 B2 6/2010 Kawaguchi et al.
9,013,650 B2 4/2015 Yamazaki et al.
(Continued)

FOREIGN PATENT DOCUMENTS

| CN | 1685769 A | 10/2005 |
| CN | 102290422 A | 12/2011 |
| CN | 203367284 U | 12/2013 |

OTHER PUBLICATIONS

Chinese Office Action of Chinese Application No. 201310334937.8, mailed May 5, 2015 with English translation.

(Continued)

*Primary Examiner* — Mamadou Diallo
(74) *Attorney, Agent, or Firm* — Collard & Roe, P.C.

(57) ABSTRACT

A flexible organic light emitting diode display device, comprising: a first flexible substrate and a second flexible substrate opposite to the first flexible substrate wherein on the first flexible substrate, there are formed in sequence a thin film transistor, a first passivation layer, a first electrode, an organic electroluminescence layer, a second electrode, a stress absorption layer is disposed between the second electrode and the second flexible substrate, and material for the stress absorption layer is a resin material. The stress absorption layer of the flexible organic light emitting diode display device can absorb a stress occurring as it is bent, so as to prevent electrodes from being broken due to the action of the stress and affecting the display quality. There is further disclosed a manufacturing method of the flexible organic light emitting diode display device.

17 Claims, 2 Drawing Sheets

(52) U.S. Cl.
CPC ............ *H01L27/3244* (2013.01); *H01L 51/52* (2013.01); *H01L 51/5253* (2013.01); *H01L 51/56* (2013.01); *H01L 51/5012* (2013.01); *H01L 51/5203* (2013.01); *H01L 2227/323* (2013.01); *H01L 2251/5338* (2013.01)

(56) References Cited

U.S. PATENT DOCUMENTS

2005/0110020 A1   5/2005   Hayashi et al.
2014/0042399 A1*  2/2014   Park et al. .................. 257/40

OTHER PUBLICATIONS

English Translation of the International Search Report of PCT/CN2013/086466 published in English on Feb. 5, 2015.

International Search Report, International Preliminary Report on Patentability and Written Opinion of the International Searching Authority of PCT/CN2013/086466 in Chinese, mailed May 9, 2014.

English translation of the International Preliminary Report on Patentability and Written Opinion of the International Searching Authority of PCT/CN2013/086466, issued Feb. 2, 2016.

* cited by examiner

FLEXIBLE ORGANIC LIGHT EMITTING DIODE DISPLAY DEVICE AND MANUFACTURING METHOD THEREOF

CROSS REFERENCE TO RELATED APPLICATIONS

This application is the National Stage of PCT/CN2013/086466 filed on Nov. 1, 2013, which claims priority under 35 U.S.C. §119 of Chinese Application No. 201310334937.8 filed on Aug. 2, 2013, the disclosure of which is incorporated by reference. The international application under PCT article 21(2) was not published in English.

TECHNICAL FIELD

Embodiments of the present invention relate to a flexible organic light emitting diode display device and a manufacturing method thereof.

BACKGROUND

Flexible display devices have many advantages, such as impact-proof, strong resistance to quake, light weight, small volume, good portability and the like.

The main flexible display devices at present can be basically classified into three types: an electronic paper (or flexible electrophoresis display), a flexible organic light emitting diode (OLED) display, a flexible liquid crystal display, etc.

Referring to FIG. 1, it can be seen that, a conventional flexible organic light emitting diode display device sequentially includes from bottom to top: a first flexible substrate 001, a thin film transistor (TFT) 003, a first passivation layer 005, an anode 006, a pixel defining layer 007, an organic electroluminescence layer (EL) 008, a cathode 009, a second passivation layer 012, an adhesive 010 and a second flexible substrate 011. The thin film transistor (TFT) 003 sequentially includes from bottom to top: an active layer 014, a gate insulating layer 002, a gate electrode 016, an interlayer insulating layer 004, a drain electrode 015 and a source electrode 017.

Electrodes of the flexible organic light emitting diode display device are of metallic materials, and may be broken under the action of stress as the display is bent, which therefore affects display quality.

SUMMARY

According to embodiments of the present invention, there are provided a flexible organic light emitting diode display device and a manufacturing method thereof, for preventing electrodes in the flexible display device from being broken due to the action of a stress and improving the display quality.

According to an embodiment of the invention, there is provided a flexible organic light emitting diode display device, comprising: a first flexible substrate and a second flexible substrate opposite to the first flexible substrate; on the first flexible substrate, there are formed in sequence a thin film transistor (TFT), a first passivation layer, a first electrode, an organic electroluminescence layer, and a second electrode, a stress absorption layer is disposed between the second electrode and the second flexible substrate, and a material for the stress absorption layer is a resin material.

According to the invention, the stress absorption layer is provided between the second electrode and the second flexible substrate, the stress from the second flexible substrate that occurs as the flexible organic light emitting diode display device is bent is absorbed and released. Thus, electrodes of the flexible organic light emitting diode display device are prevented from being broken due to the action of the stress, and the display quality of the flexible organic light emitting diode display device is improved.

For example, a thickness of the stress absorption layer is in the range of 1 micron to 5 micron. As such, a thickness of the stress absorption layer is appropriate, and the flexibility and display effect of the flexible organic light emitting diode display device are good.

For example, the stress absorption layer has a protruding structure facing the second flexible substrate. As such, the stress from the second flexible substrate that occurs upon bending can be delivered to the stress absorption layer through the protruding structure more favorably, and the stress is absorbed and released by the stress absorption layer. Thus, the electrodes of the flexible organic light emitting diode display device are prevented from being broken due to the action of the stress and affecting the display quality.

For example, a cross-section of the protruding structure is in the shape of a trapezoid or a rectangle. As such, the stress from the second flexible substrate that occurs upon bending is delivered to the stress absorption layer through the protruding structure, and the stress is absorbed and released by the stress absorption layer. Thus, the electrodes of the flexible organic light emitting diode display device are prevented from being broken due to the action of the stress and affecting the display quality.

For example, the protruding structure contacts with the second flexible substrate directly, or the protruding structure is arranged in an adhesive for fixing the second flexible substrate to the stress absorption layer. As such, the stress from the second flexible substrate that occurs upon bending is delivered to the stress absorption layer through the protruding structure, and the stress is absorbed and released by the stress absorption layer. Thus, the electrodes of the flexible organic light emitting diode display device are prevented from being broken due to the action of the stress and affecting the display quality.

For example, the resin material is an acrylic resin. An acrylic resin material is flexible to an extent per se, and therefore the application of an acrylic resin to the stress absorption layer enables the stress that occurs as the flexible organic light emitting diode display device is bent to be released by the resin material.

For example, the resin material is a photosensitive resin material. In this way, a protruding structure can be provided on the stress absorption layer by way of exposure and development, so that the stress from the second flexible substrate that occurs upon bending can be transferred to the stress absorption layer through the protruding structure more favorably, to be absorbed and released by the stress absorption layer. Thus, the electrodes of the flexible organic light emitting diode display device are prevented from being broken due to the action of the stress and affecting the display quality.

For example, the resin material is a transparent resin material. This enables the manufactured flexible organic light emitting diode display device to be a display device having a top-emission structure.

For example, the first electrode is a reflective anode, and the second electrode is a transparent cathode; or the first electrode is a transparent anode, and the second electrode is a reflective cathode; or the first electrode is a reflective cathode, and the second electrode is a transparent anode. The flexible organic light emitting diode display device may be an organic light emitting diode display device having a top-emission structure, an organic light emitting diode display device having a bottom-emission structure, or an inverted organic light emitting diode display device.

For example, a second passivation layer may further be provided between the second electrode and the stress absorption layer, and it can play roles of planarization, insulation and protection.

According to an embodiment of the invention, there is further provided a manufacturing method of a flexible organic light emitting diode display device, comprising: forming a thin film transistor (TFT) and a first passivation layer on a first flexible substrate, respectively; forming a via hole at a position of the first passivation layer corresponding to a drain electrode of the TFT; forming a first electrode, an organic electroluminescence layer and a second electrode on the first passivation layer, respectively; forming a stress absorption layer on the second electrode; material for the stress absorption layer being a resin material; and forming a second flexible substrate on the stress absorption layer.

For example, in the above method, a photosensitive resin material is coated on the second electrode, and is formed to be the stress absorption layer having a protruding structure by way of exposure and development.

For example, in the above method, before manufacture of the stress absorption layer, a second passivation layer is produced on the second electrode.

For example, forming of the stress absorption layer on the cathode includes: coating a photosensitive resin material on the second electrode, and forming the stress absorption layer having a protruding structure by way of conducting exposure and development on it.

For example, before manufacture of the stress absorption layer, a second passivation layer is produced on the second electrode. The second passivation layer can play roles of planarization and insulation.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) within the scope sought for protection by the invention.

According to embodiments of the invention, there are provided a flexible organic light emitting diode display device and a manufacturing method thereof, for achieving the effect of absorbing stress occurring as the flexible organic light emitting diode display device is bent, and preventing electrodes of the flexible organic light emitting diode display device from being broken due to the action of the stress and from affecting the display quality.

According to an embodiment of the invention, there is provided a flexible organic light emitting diode display device, comprising: a first flexible substrate and a second flexible substrate opposite to the first flexible substrate; on the first flexible substrate, there are formed in sequence a thin film transistor (TFT), a first passivation layer, a first electrode, an organic electroluminescence layer, and a second electrode; between the second electrode and the second flexible substrate, there is further included a stress absorption layer, the material for which is a resin material.

Figure 1:
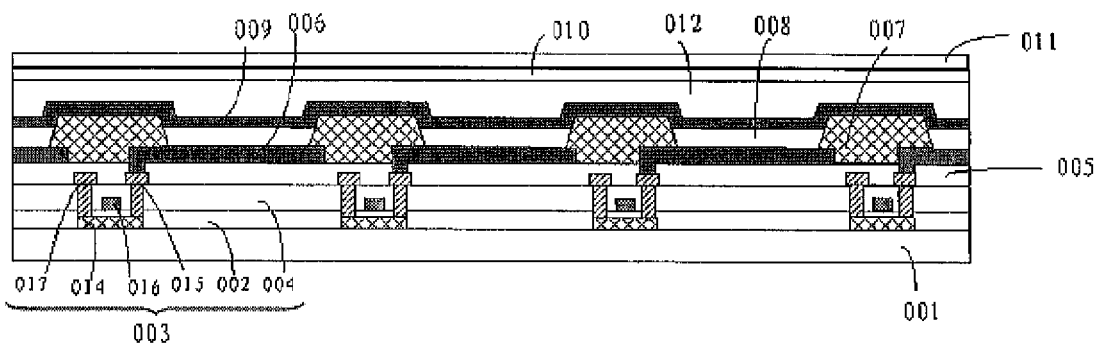
FIG. 1 is a structurally schematic view illustrating a conventional flexible organic light emitting diode display device.
Figure 2:
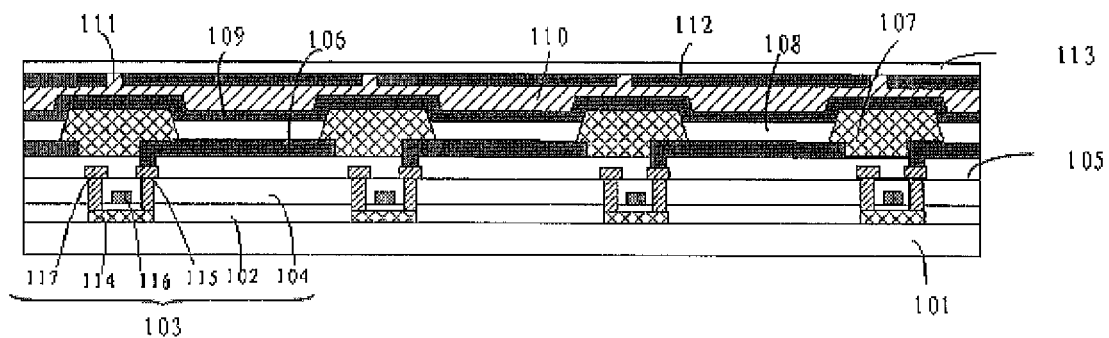
FIG. 2 is a structurally schematic view illustrating a flexible organic light emitting diode display device provided by an embodiment of the invention.
Figure 3:
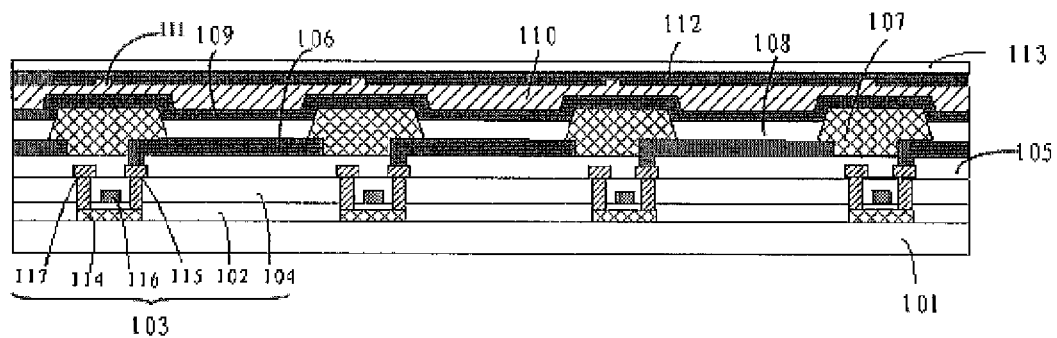
FIG. 3 is a structurally schematic view illustrating a flexible organic light emitting diode display device provided by an embodiment of the invention.

FIG. 2 and FIG. 3 are structurally schematic views illustrating flexible display devices provided by the embodiment of the invention. It can be seen in connection with FIG. 2 that the flexible display device sequentially includes from bottom to top: a first flexible substrate 101, a thin film transistor (TFT) 103, a first passivation layer 105, a first electrode 106, a pixel defining layer 107, an organic electroluminescence layer (EL) 108, a second electrode 109, a stress absorption layer 110, an adhesive 112 and a second flexible substrate 113. The thin film transistor (TFT) 103 sequentially includes from bottom to top: an active layer 114, a gate insulating layer 102, a gate electrode 116, an interlayer insulating layer 104, a drain electrode 115, and a source electrode 117. The stress absorption layer 110 may have protruding structures 111. An area defined by the pixel defining layer 107 is a light emitting unit.

The flexible substrate of the embodiment of the invention may be a plastic substrate, a glass substrate, a metal substrate or a composite substrate. There is no specific limitation on the material for the substrate in the embodiment of the invention.

The first electrode 106 is electrically connected to the drain electrode 115 through a via hole in the first passivation layer 105, red, green and blue (RGB) organic electroluminescence layers (EL) 108 are located between the first electrode 106 and the second electrode 109; a stress absorption layer 110 is located between the second electrode 109 and the second flexible substrate 113. The material for the stress absorption layer 110 is a resin material, for example, which is an acrylic resin. The resin material may also be a transparent resin material, and may be a photosensitive resin material as well. Protruding structures 111 are provided on the stress absorption layer 110, and an adhesive 112 may be coated between the protruding structures 111, so as to adhere to the second flexible substrate 113. For example, the protruding structures 111 may contact with the second flexible substrate 113 directly, referring to FIG. 2; or, the protruding structures 111 are arranged in an adhesive for fixing the second flexible substrate to the stress absorption layer, referring to FIG. 3. After formation of the second electrode 109 for the flexible display device is completed, a photosensitive resin material is coated on the second electrode 109, and subjected to exposure and development, so as to manufacture protruding structures on the stress absorption layer 110. An adhesive is coated between the protruding structures, for adhering to the second flexible substrate 113.

The thickness of the stress absorption layer 110 may be in the range of 1 micron to 5 micron. If the stress absorption layer 110 is less than 1 micron in thickness, then the stress absorbing effect is not good; and if thickness of the stress absorption layer is greater than 5 micron, then flexibility and display effect of the flexible display device may be affected.

There are no specific limits on the shape of the protruding structures 111 in the embodiment of the invention, and the cross-sections of the protruding structure may be in the shape of a trapezoid, a rectangle, or the like. Spacing between the protruding structures 111 may be set as desired, each of light emitting units may be provided corresponding to one of the protruding structures 111; and a plurality of light emitting units may be provided corresponding to one of the protruding structures 111. For example, three to five light emitting units are provided corresponding to one of the protruding structures 111.

The flexible organic light emitting diode display device may further include a flexible organic light emitting diode display device having a top-emission structure, a flexible organic light emitting diode display device having a bottom-emission structure or an inverted flexible organic light emitting diode display device. For the flexible organic light emitting diode display device having the top-emission structure, the first electrode is a reflective anode, and the second electrode is a transparent cathode; for the flexible organic light emitting diode display device having the bottom-emission structure, the first electrode is a transparent anode, and the second electrode is a reflective cathode; and for the inverted flexible organic light emitting diode display device, the first electrode is a reflective cathode, and the second electrode is a transparent anode. A second passivation layer may further be provided between the second electrode (cathode) and the stress absorption layer. The second passivation layer can play roles of planarization, insulation and protection.

According to the embodiment, because the stress absorption layer is formed between the cathode and the second flexible substrate, the stress from the second flexible substrate that occurs as the flexible display device is bent is absorbed and released by the stress absorption layer, so as to prevent electrodes of the flexible organic light emitting diode display device from being broken due to the action of the stress and to improve the display quality of the flexible display device.

Figure 4:
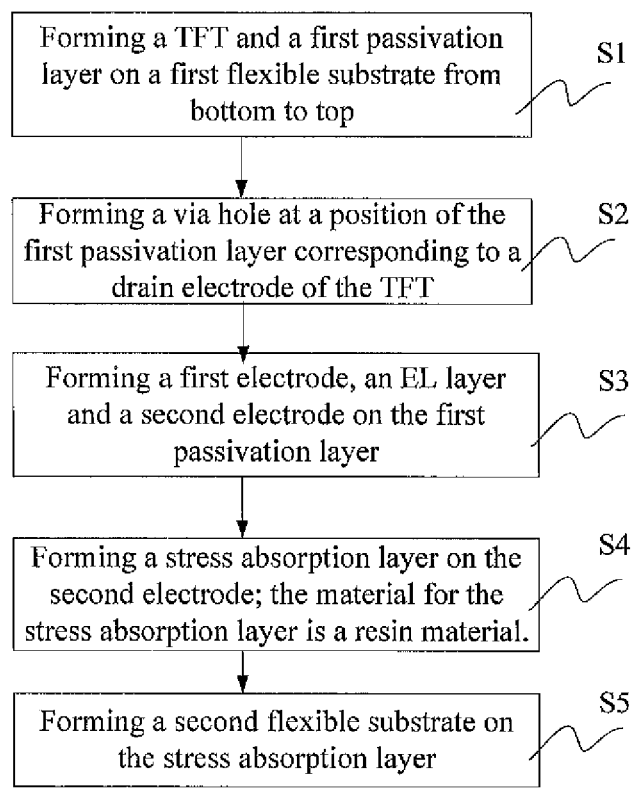
FIG. 4 is a schematic view illustrating the flowchart of a manufacturing method of a flexible organic light emitting diode display device provided by an embodiment of the invention.

According to an embodiment of the invention, there is further provided a manufacturing method of a flexible organic light emitting diode display device. FIG. 4 is a schematic view illustrating the flowchart of a manufacturing method of a flexible display device provided by an embodiment of the invention, and the manufacturing method of a flexible display device may be carried on as follows.

(S1), a thin film transistor (TFT) and a first passivation layer are manufactured on a first flexible substrate from bottom to top, respectively. The thin film transistor may be of a top-gate structure, and may also be of a bottom-gate structure. For a TFT in the top-gate structure, it may sequentially include from bottom to top: an active layer, a gate insulating layer, a gate electrode, an interlayer insulating layer, a drain electrode and a source electrode; and for a TFT in the bottom-gate structure, it may sequentially include from bottom to top: a gate electrode, a gate insulating layer, an active layer, a drain electrode and a source electrode.

(S2), A via hole is formed at a position of the first passivation layer corresponding to a drain electrode of the TFT.

(S3), A first electrode, an organic electroluminescence layer (EL) and a second electrode are manufactured on the first passivation layer, respectively; and the organic electroluminescence layer (EL) is located between the first electrode and the second electrode.

(S4), a stress absorption layer is produced on the second electrode; and the material for the stress absorption layer is a resin material. For example, a photosensitive resin material is coated on the second electrode, and is formed to be the stress absorption layer having protruding structures by way of exposure and development. The protruding structure and the stress absorption layer are formed integrally.

For example, before the manufacture of the stress absorption layer, a second passivation layer is produced on the second electrode.

(S5), A second flexible substrate is produced on the stress absorption layer. For example, the process includes: an adhesive is coated between the protruding structures so as to adhere to the second flexible substrate. For example, the protruding structures may contact with the second flexible substrate directly, referring to FIG. 2; or, the protruding structures are arranged in an adhesive for fixing the second flexible substrate to the stress absorption layer, referring to FIG. 3.

The resin material for the stress absorption layer is a resin material. Resin materials are flexible to an extent per se, so that the stress that occurs as the flexible organic light emitting diode display device is bent is released by the resin material. For example, the resin material is an acrylic resin. The resin material also includes a transparent resin material, which enables the manufactured flexible organic light emitting diode display device to be a display device with a top-emission structure. The resin material also includes a photosensitive resin material, and as such, after the manufacture of the second electrode for the flexible display device is completed, a transparent, a photosensitive resin material is coated on the second electrode and subjected to exposure and development, so as to manufacture protruding structures on the stress absorption layer. The protruding structures act to better transfer the stress that occurs as the second substrate is bent from the second flexible substrate to the stress absorption layer, and the stress is absorbed by the stress absorption layer, so that electrodes of the flexible organic light emitting diode display device are prevented from being broken due to the action of the stress and affecting the display quality. The thickness of the stress absorption layer 110 may be in the range of 1 micron to 5 micron. If the stress absorption layer 110 is less than 1 micron, then the stress absorbing effect is not good; and if the thickness of the stress absorption layer is greater than 5 micron, then flexibility and display effect of the flexible display device may be affected.

There are no specific limitations on the shape of the protruding structures, and the cross-sections of the protruding structures may be in the shape of a trapezoid, a rectangle, or the like. Spacing between the protruding structures may be set as desired, and each of light emitting units may be provided corresponding to one of the protruding structures; and a plurality of light emitting units may be provided corresponding to one of the protruding structures. For example, three to five light emitting units are provided corresponding to one of the protruding structures. The area defined by the pixel defining layer is one light emitting unit.

Other layer (e.g., a second passivation layer) may further be provided between the stress absorption layer and the second electrode.

Passivation layers stated in embodiments of the invention can play roles of planarization, insulation and protection. For example, the passivation layers may be of silicon nitride.

The flexible organic light emitting diode display device may includes a flexible organic light emitting diode display device having a top-emission structure, a flexible organic light emitting diode display device having a bottom-emission structure or an inverted flexible organic light emitting diode display device. For the flexible organic light emitting diode display device having the top-emission structure, the first electrode is a reflective anode, and the second electrode is a transparent cathode; for the flexible organic light emitting diode display device having the bottom-emission structure, the first electrode is a transparent anode, and the second electrode is a reflective cathode; and for the inverted flexible organic light emitting diode display device, the first electrode is a reflective cathode, and the second electrode is a transparent anode.

In summary, according to the invention, there are provided a flexible organic light emitting diode display device and manufacturing method thereof, for achieving the effect of absorbing of a stress occurring as the flexible organic light emitting diode display device is bent, and preventing electrodes of the flexible organic light emitting diode display device from being broken due to the action of the stress and from affecting the display quality, by way of manufacturing a stress absorption layer for absorbing the stress from a second flexible substrate between a second substrate and the second flexible substrate.

Descriptions made above are merely exemplary embodiments of the invention, but are not used to limit the protection scope of the invention. The protection scope of the invention is determined by attached claims.

The invention claimed is:

1. A flexible organic light emitting diode display device, comprising: a first flexible substrate and a second flexible substrate opposite to the first flexible substrate, wherein on the first flexible substrate, there are formed in sequence a thin film transistor, a first passivation layer, a first electrode, an organic electroluminescence layer, and a second electrode, a stress absorption layer is disposed between the second electrode and the second flexible substrate, and a material for the stress absorption layer is a resin material, wherein the stress absorption layer has a protruding structure facing the second flexible substrate.

2. The display device claimed as claim 1, wherein a thickness of the stress absorption layer is in the range of 1 micron to 5 micron.

3. The display device claimed as claim 1, wherein a cross-section of the protruding structure is in a shape of a trapezoid or a rectangle.

4. The display device claimed as claim 1, wherein the protruding structure contacts with the second flexible substrate directly, or the protruding structure is arranged in an adhesive for fixing the second flexible substrate to the stress absorption layer.

5. The display device claimed as claim 1, wherein the resin material is an acrylic resin.

6. The display device claimed as claim 1, wherein the resin material is a photosensitive resin material.

7. The display device claimed as claim 1, wherein the resin material is a transparent resin material.

8. The display device claimed as claim 1, wherein the first electrode is a reflective anode, and the second electrode is a transparent cathode; or the first electrode is a transparent anode, and the second electrode is a reflective cathode; or the first electrode is a reflective cathode, and the second electrode is a transparent anode.

9. The display device claimed as claim 1, wherein a second passivation layer is further included between the second electrode and the stress absorption layer.

10. The display device claimed as claim 3, wherein the protruding structure contacts with the second flexible substrate directly, or the protruding structure is arranged in an adhesive for fixing the second flexible substrate to the stress absorption layer.

11. The display device claimed as claim 1, wherein a second passivation layer is further included between the second electrode and the stress absorption layer.

12. The display device claimed as claim 4, wherein a second passivation layer is further included between the second electrode and the stress absorption layer.

13. The display device claimed as claim 8, wherein a second passivation layer is further included between the second electrode and the stress absorption layer.

14. A manufacturing method of a flexible organic light emitting diode display device, comprising:
    forming a thin film transistor (TFT) and a first passivation layer on a first flexible substrate, respectively;
    forming a via hole at a position of the first passivation layer corresponding to a drain electrode of the TFT;
    forming a first electrode, an organic electroluminescence layer and a second electrode on the first passivation layer, respectively;
    forming a stress absorption layer on the second electrode, and a material for the stress absorption layer is a resin material; and
    forming a second flexible substrate on the stress absorption layer,
    wherein producing of the stress absorption layer on the second electrode includes:
    coating a photosensitive resin material on the second electrode, and forming the stress absorption layer having a protruding structure by way of exposure and development.

15. The method claimed as claim 14, further comprising producing a second passivation layer on the second electrode before manufacture of the stress absorption layer.

16. The display device claimed as claim 14, wherein a cross-section of the protruding structure is in a shape of a trapezoid or a rectangle.

17. The display device claimed as claim 14, wherein the protruding structure contacts with the second flexible substrate directly, or the protruding structure is arranged in an adhesive for fixing the second flexible substrate to the stress absorption layer.

* * * * *